(12) United States Patent
Pierce

(10) Patent No.: US 6,673,653 B2
(45) Date of Patent: Jan. 6, 2004

(54) WAFER-INTERPOSER USING A CERAMIC SUBSTRATE

(75) Inventor: John L. Pierce, Dallas, TX (US)

(73) Assignee: Eaglestone Partners I, LLC, Long Beach, CA (US)

( * ) Notice: Subject to any disclaimer, the term of this patent is extended or adjusted under 35 U.S.C. 154(b) by 77 days.

(21) Appl. No.: 09/792,257

(22) Filed: Feb. 23, 2001

(65) Prior Publication Data

US 2002/0119600 A1 Aug. 29, 2002

(51) Int. Cl.[7] .............................................. H01L 21/44
(52) U.S. Cl. ...................... 438/118; 438/108; 438/113; 438/119; 257/698; 257/703; 257/774
(58) Field of Search .................................. 438/107, 108, 438/118, 119, 113, 125; 257/698, 703, 737, 774, 778

(56) References Cited

U.S. PATENT DOCUMENTS

| | | |
|---|---|---|
| 3,939,588 A | 2/1976 | Riley |
| 4,577,214 A | 3/1986 | Schaper |
| 4,617,730 A | 10/1986 | Geldermans et al. |
| 4,628,411 A | 12/1986 | Balderes et al. |
| 4,688,151 A | 8/1987 | Kraus et al. |
| 4,868,712 A | 9/1989 | Woodman |
| 5,068,558 A | 2/1991 | Grube et al. |
| 4,998,885 A | 3/1991 | Beaman |
| 5,016,138 A | 5/1991 | Woodman |
| 5,060,052 A | 10/1991 | Casto et al. |
| 5,065,227 A | 11/1991 | Frankeny et al. |
| 5,123,850 A | 6/1992 | Elder et al. |
| 5,132,613 A | 7/1992 | Papae et al. |
| 5,148,265 A | 9/1992 | Khandros et al. |
| 5,148,266 A | 9/1992 | Khandros et al. |
| 5,309,021 A | 5/1994 | Shimamoto et al. |
| 5,327,325 A | 7/1994 | Nicewarner, Jr. |

(List continued on next page.)

*Primary Examiner*—Kevin M. Picardat
(74) *Attorney, Agent, or Firm*—Lawrence R. Youst; Danamraj & Youst, P.C.

(57) ABSTRACT

The present invention provides a method and apparatus for testing semiconductor wafers that is simple and allows testing prior to dicing so that the need to temporarily package individual dies for testing is eliminated. As a result, the number of manufacturing steps is reduced, thus increasing first pass yields. In addition, manufacturing time is decreased, thereby improving cycle times and avoiding additional costs. After testing, the wafer is diced into the individual circuits, eliminating the need for additional packaging. One form of the present invention provides an interposer substrate made of a ceramic material that has an upper and a lower surface. There are one or more first electrical contacts on the lower surface and one or more second electrical contacts on the upper surface. There are also one or more electrical pathways that connect the first and second electrical contacts.

31 Claims, 2 Drawing Sheets

U.S. PATENT DOCUMENTS

| | | |
|---|---|---|
| 5,347,159 A | 9/1994 | Khandros et al. |
| 5,347,162 A | 9/1994 | Pasch |
| 5,371,654 A | 12/1994 | Beaman et al. |
| 5,382,898 A | 1/1995 | Subramanian |
| 5,384,691 A | 1/1995 | Neugebauer, et al. |
| 5,399,505 A | 3/1995 | Dasse et al. |
| 5,399,898 A | 3/1995 | Rostoker |
| 5,410,259 A | 4/1995 | Fujihara et al. |
| 5,476,211 A | 12/1995 | Khandros |
| 5,477,160 A | 12/1995 | Love |
| 5,483,421 A | 1/1996 | Gedney et al. |
| 5,489,804 A | 2/1996 | Pasch |
| 5,491,612 A | 2/1996 | Nicewarner, Jr. |
| 5,497,079 A | 3/1996 | Yamada et al. |
| 5,504,369 A | 4/1996 | Dasse et al. |
| 5,517,515 A | 5/1996 | Spall et al. |
| 5,518,964 A | 5/1996 | DiStefano et al. |
| 5,531,022 A | 7/1996 | Beaman et al. |
| 5,532,612 A | 7/1996 | Liang |
| 5,544,017 A | 8/1996 | Beilin et al. |
| 5,570,032 A | 10/1996 | Atkins et al. |
| 5,579,207 A | 11/1996 | Hayden et al. |
| 5,594,273 A | 1/1997 | Dasse et al. |
| 5,600,257 A | 2/1997 | Leas et al. |
| 5,600,541 A | 2/1997 | Bone et al. |
| 5,612,575 A | 3/1997 | De Givry |
| 5,615,089 A | 3/1997 | Yoneda et al. |
| 5,635,101 A | 6/1997 | Pepe et al. |
| 5,637,920 A | 6/1997 | Loo |
| 5,654,588 A | 8/1997 | Dasse et al. |
| 5,655,290 A | 8/1997 | Moresco et al. |
| 5,685,885 A | 11/1997 | Khandros et al. |
| 5,701,666 A | 12/1997 | DeHaven et al. |
| 5,759,047 A | 6/1998 | Brodsky et al. |
| 5,764,071 A | 6/1998 | Chan et al. |
| 5,789,807 A | 8/1998 | Correale, Jr. |
| 5,794,175 A | 8/1998 | Conner |
| 5,796,746 A | 8/1998 | Farnworth et al. |
| 5,798,652 A | 8/1998 | Traci |
| 5,800,184 A | 9/1998 | Lopergolo et al. |
| 5,802,713 A | 9/1998 | Deamer |
| 5,806,181 A | 9/1998 | Khandros et al. |
| 5,832,601 A | 11/1998 | Eldridge et al. |
| 5,834,946 A | 11/1998 | Albrow et al. |
| 5,838,072 A | 11/1998 | Li et al. |
| 5,838,060 A | 12/1998 | Comer |
| 5,844,803 A | 12/1998 | Beffa |
| 5,848,467 A | 12/1998 | Khandros et al. |
| 5,854,507 A | 12/1998 | Miremadi et al. |
| 5,878,486 A | 3/1999 | Eldridge et al. |
| 5,885,849 A | 3/1999 | DiStefano et al. |
| 5,892,287 A | 4/1999 | Hoffman et al. |
| 5,897,326 A | 4/1999 | Eldridge et al. |
| 5,900,738 A | 5/1999 | Khandros et al. |
| 5,905,382 A | 5/1999 | Wood et al. |
| 5,915,752 A | 6/1999 | DiStefano et al. |
| 5,927,193 A | 7/1999 | Balz et al. |
| 5,929,651 A | 7/1999 | Leas et al. |
| 5,936,847 A | 8/1999 | Kazle |
| 5,942,246 A | 8/1999 | Mayhew et al. |
| 5,943,213 A | 8/1999 | Sasov |
| 5,949,246 A | 9/1999 | Frankeny et al. |
| 5,950,070 A | 9/1999 | Razon et al. |
| 5,950,304 A | 9/1999 | Khandros et al. |
| 5,959,462 A | 9/1999 | Lum |
| 5,977,640 A | 11/1999 | Bertin et al. |
| 5,984,691 A | 11/1999 | Brodsky et al. |
| 5,994,168 A * | 11/1999 | Egawa ................. 438/118 |
| 6,002,178 A | 12/1999 | Lin |
| 6,020,220 A * | 2/2000 | Gilleo et al. ............ 438/118 |
| 6,024,275 A | 2/2000 | Takiar |
| 6,032,356 A | 3/2000 | Eldridge et al. |
| 6,034,332 A | 3/2000 | Moresco et al. |
| 6,046,600 A | 4/2000 | Whetsel |
| 6,049,467 A | 4/2000 | Tamarkin et al. |
| 6,050,829 A | 4/2000 | Eldridge et al. |
| 6,053,395 A | 4/2000 | Sasaki |
| 6,064,213 A | 5/2000 | Khandros et al. |
| 6,069,026 A | 5/2000 | Terrill et al. |
| 6,080,264 A | 6/2000 | Ball |
| 6,080,494 A | 6/2000 | Abbott |
| 6,082,610 A | 7/2000 | Shangguan et al. |
| 6,083,773 A | 7/2000 | Lake |
| 6,098,278 A | 8/2000 | Vindasius et al. |
| 6,101,100 A | 8/2000 | Londa |
| 6,104,202 A | 8/2000 | Slocum et al. |
| 6,133,070 A | 10/2000 | Yagi et al. |
| 6,136,681 A | 10/2000 | Razon et al. |
| 6,137,299 A | 10/2000 | Cadieux et al. |
| 6,147,400 A | 11/2000 | Faraci et al. |
| 6,154,371 A | 11/2000 | Oba et al. |
| 6,218,910 B1 | 4/2001 | Miller |
| 6,242,279 B1 | 6/2001 | Ho et al. |
| 6,242,932 B1 | 6/2001 | Hembree |
| 6,246,247 B1 | 6/2001 | Eldridge et al. |
| 6,258,627 B1 * | 7/2001 | Benenati et al. ............ 438/108 |
| 6,275,051 B1 | 8/2001 | Bachelder et al. |
| 6,281,046 B1 | 8/2001 | Lam |
| 6,303,992 B1 | 10/2001 | Van Pham et al. |
| 6,313,522 B1 | 11/2001 | Akram et al. |
| 6,319,829 B1 * | 11/2001 | Pasco et al. ................. 438/108 |
| 6,372,547 B2 * | 4/2002 | Nakamura et al. .......... 438/118 |
| 6,372,548 B2 * | 4/2002 | Bessho et al. ............. 438/118 |
| 6,392,428 B1 | 5/2002 | Kline et al. |
| 6,432,744 B1 | 8/2002 | Amador et al. |
| 6,440,771 B1 * | 8/2002 | Pierce ........................ 438/118 |
| 6,483,043 B1 | 11/2002 | Kline |
| 6,483,330 B1 | 11/2002 | Kline |
| 6,524,885 B2 | 2/2003 | Pierce |
| 6,529,022 B2 | 3/2003 | Pierce |
| 6,537,831 B1 | 3/2003 | Kline |

\* cited by examiner

WAFER-INTERPOSER USING A CERAMIC SUBSTRATE

FIELD OF THE INVENTION

The present invention relates generally to the field of integrated circuits, and more particularly, to an interposer assembly apparatus and method.

BACKGROUND OF THE INVENTION

Semiconductor die have traditionally been electrically connected to a package by wire bonding techniques, in which wires are attached to pads of the die and to pads located in the cavity of the plastic or ceramic package. Wire bonding is still the interconnection strategy most often used in the semiconductor industry today. But the growing demand for products that are smaller, faster, less expensive, more reliable and have a reduced thermal profile has pushed wire bonding technology to its limits (and beyond) thereby creating barriers to sustained product improvement and growth.

The high-performance alternative to wire bonding techniques are flip chip techniques, in which solder balls or bumps are attached to the input/output (I/O) pads of the die at the wafer level. The bumped die is flipped over and attached to a substrate "face down," rather than "face up" as with wire bonding. Flip chips resolve many, if not all, of the problems introduced by wire bonding. First, flip chips have fewer electrical interconnects than wire bonding, which results in improved reliability and fewer manufacturing steps, thereby reducing production costs. Second, the face down mounting of a flip chip die on a substrate allows superior thermal management techniques to be deployed than those available in wire bonding. Third, flip chips allow I/O to be located essentially anywhere on the die, within the limits of substrate pitch technology and manufacturing equipment, instead of forcing I/O to the peripheral of the die as in wire bonding. This results in increased I/O density and system miniaturization.

Despite the advantages of the flip chip, wide spread commercial acceptance of the flip chip has been hindered by testing issues. To ensure proper performance, the die should be adequately tested before it is assembled into a product; otherwise, manufacturing yields at the module and system level can suffer and be unacceptably low. Under some circumstances, a defective die can force an entire subassembly to be scrapped. One attempt to address this testing issue has been to perform a wafer probe, followed by dicing the wafer and temporarily packaging each die into a test fixture of some sort. Performance testing is subsequently executed. Burn-in testing is often included in this process to eliminate any die having manufacturing process defects. Following the successful completion of these tests, the die are removed from the test fixture and either retailed as a Known Good Die ("KGD") product or used by the manufacturer in an end product, such as a Flip Chip Module ("FCM"). The Flip Chip Module may constitute a subassembly in a larger system product. This Known Good Die process is inherently inefficient due to its complexity.

Accordingly, there is a need for an interposer assembly apparatus and method that meets all of the criteria outlined above, and that allows testing at the wafer level before dicing, and eliminates the need for temporarily packaging the die in a carrier.

Two characteristics that are important when selecting a material to form an interposer substrate are the coefficient of thermal expansion (CTE), and the ability to be planed to a high degree of flatness. The CTE of the material chosen should be close to that of a silicon wafer if the end use will be subjected to a range of temperatures, and the planarity should be as flat as possible, in any event, at least as flat as the semiconductor wafer the interposer substrate will be attached to. The material used for the interposer substrate should also be structurally sound and capable of being patterned with traces, connectivity pads and vias. It should also be capable of withstanding the temperatures required to solder the finished semiconductor circuit to a printed circuit board.

SUMMARY OF THE INVENTION

The present invention provides a method and apparatus for testing semiconductor wafers that is simple and allows testing prior to dicing so that the need to temporarily package individual dies for testing is eliminated. As a result, the number of manufacturing steps is reduced, thus increasing first pass yields. In addition, manufacturing time is decreased, thereby improving cycle times and avoiding additional costs. Eliminating the need to singulate and package the dies before testing results in a significant cost avoidance opportunity for chip manufacturers. The fact that the use of the wafer-interposer accomplishes all of this while providing cost effective packaging is another substantial benefit of the present invention.

The ceramic substrate of the present invention has a good coefficient of thermal expansion that is close to that of a silicon wafer. Moreover, the ceramic substrate can be planed to a high degree of flatness and is capable of being patterned with traces, connectivity pads and electrical passageways or vias. The ceramic substrate also is capable of withstanding the temperatures required to solder the finished semiconductor circuit to a printed circuit board.

The interposer assembly of the present invention revolutionizes the semiconductor fabrication process by enabling burn-in and electrical testing at the wafer level. The interposer eliminates the need to singulate, package, test, and unpackage each die in order to arrive at the Known Good Die product stage. The interposer remains attached to the die following dicing, and thus provides the additional benefit of redistributing the die I/O pads so that they can be larger and more easily accessed and/or mated to other downstream components.

One form of the present invention provides an interposer substrate made of a ceramic material that has an upper and a lower surface. There are one or more first electrical contacts on the lower surface and one or more second electrical contacts on the upper surface. There are also one or more electrical pathways that connect the first and second electrical contacts.

Another form of the present invention provides an interposer assembly that includes a ceramic substrate having an upper and a lower surface with one or more first electrical contacts on the lower surface and one or more second electrical contacts on the upper surface. One or more electrical pathways connect the first and second electrical contacts. A semiconductor wafer, including one or more semiconductor dies, and having an upper surface and lower surface with one or more third electrical contacts on the first surface. There are one or more third electrical contacts on the upper surface of the semiconductor wafer, the third electrical contacts being associated with the semiconductor dies. A conductor electrically connects each first electrical contact with a corresponding third electrical contact, and a layer of no-flow underfill is disposed between the upper surface of the semiconductor wafer and the lower surface of the ceramic substrate.

Yet another form of the present invention is a method for producing an interposer substrate that includes the steps of creating one or more electrical pathways passing through a ceramic substrate having an upper surface and a lower surface. One or more first electrical contacts are attached to the one or more electrical pathways on the lower surface of the ceramic substrate. One or more second electrical contacts are attached to the one or more electrical pathways on the upper surface of the ceramic substrate.

Still another form of the present invention provides a method for producing an interposer assembly. It includes the steps of creating one or more electrical pathways passing through a ceramic substrate having an upper surface and a lower surface. One or more first electrical contacts are attached to the one or more electrical pathways on the lower surface of the ceramic substrate. One or more second electrical contacts are attached to the one or more electrical pathways on the upper surface of the ceramic substrate. A conductor and a no-flow underfill are deposited and the ceramic substrate is bonded to a semiconductor wafer such that the conductor and the no-flow underfill form an adhesive bond between the lower side of the ceramic substrate and the upper side of the semiconductor wafer.

BRIEF DESCRIPTION OF THE DRAWINGS

The above and further advantages of the present invention may be understood by referring to the following description in conjunction with the accompanying drawings in which corresponding numerals in the different figures refer to the corresponding parts in which.

DETAILED DESCRIPTION

While the making and using of various embodiments of the present invention are discussed herein in terms of an interposer substrate and wafer interposer assembly method and apparatus, it should be appreciated that the present invention provides many applicable inventive concepts that can be embodied in a wide variety of specific contexts. The specific embodiments discussed herein are merely illustrative of specific ways to make and use the invention and are not meant to limit its scope in any way.

The present invention provides a method and apparatus for testing semiconductor wafers that is simple and allows testing prior to dicing so that the need to temporarily package individual dies for testing is eliminated. As a result, the number of manufacturing steps is reduced, thus increasing first pass yields. In addition, manufacturing time is decreased, thereby improving cycle times and avoiding additional costs. Eliminating the need to singulate and package the dies before testing results in a significant cost avoidance opportunity for chip manufacturers. The fact that the use of the wafer-interposer accomplishes all of this while providing cost effective packaging is another substantial benefit of the present invention.

The ceramic substrate of the present invention has a good coefficient of thermal expansion that is close to that of a silicon wafer. Moreover, the ceramic substrate can be planed to a high degree of flatness and is capable of being patterned with traces, connectivity pads and electrical passageways or vias. The ceramic substrate also is capable of withstanding the temperatures required to solder the finished semiconductor circuit to a printed circuit board.

The interposer assembly of the present invention revolutionizes the semiconductor fabrication process by enabling burn-in and electrical testing at the wafer level. The interposer eliminates the need to singulate, package, test, and unpackage each die in order to arrive at the Known Good Die product stage. The interposer remains attached to the die following dicing, and thus provides the additional benefit of redistributing the die I/O pads so that they can be larger and more easily accessed and/or mated to other downstream components.

Figure 1:
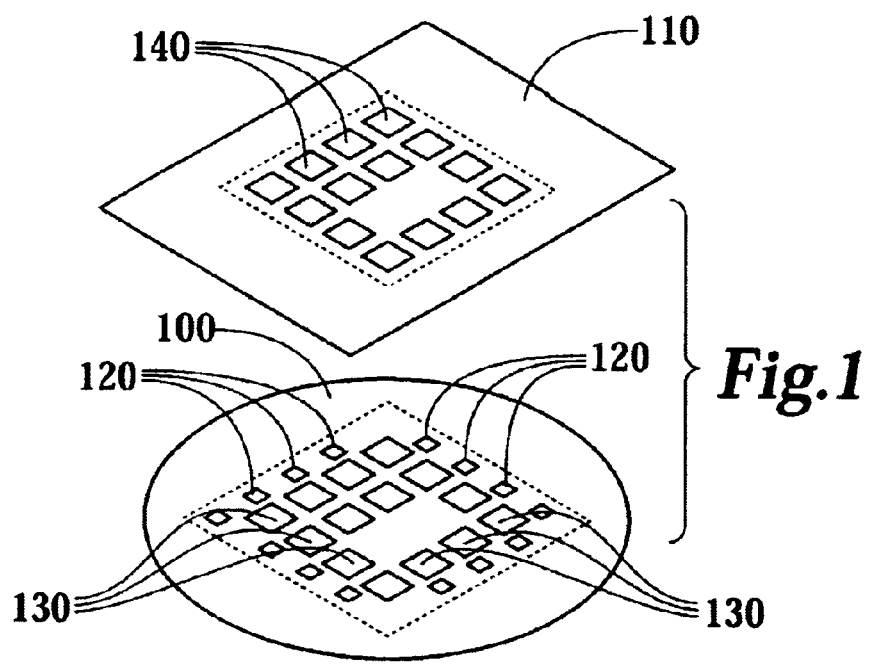
FIG. 1 depicts an exploded view of an interposer substrate and a semiconductor wafer in accordance with the present invention.

FIG. 1 depicts a semiconductor wafer 100 and a ceramic substrate 110. When attached to one another, the pair forms an interposer assembly. An exploded view of a single die is shown on the semiconductor wafer 100 enclosed by a dotted line. The die has fourteen peripheral connection pads 120. An actual wafer would have many more die and many more pads; the enlarged view is for illustrative purposes only.

Also shown on the die are fourteen larger pads 130. The larger pads 130 are formed as part of a redistribution layer (RDL) that is added to the semiconductor wafer. The RDL connects each peripheral connection pad 120 to an RDL pad 130. In this example the relationship between the peripheral and RDL pads is one-to-one, however other connectivity schemes are possible. Methods for designing and applying redistribution layers are well known in the industry. Because the RDL pads use the space in the center of the die, they can have greater size and pitch than the peripheral pads. The ability to use larger pads can be advantageous in compensating for thermal mismatches as discussed below. The larger pads also allow for easier connection to test equipment or printed circuit boards.

FIG. 1 also depicts a ceramic substrate 110. The ceramic material may be chosen to meet the needs of a particular application. For example, if the circuit does not require burn-in or extended high or low temperature testing, then alumina may be an appropriate choice. Alumina is inexpensive, but it has a relatively high coefficient of thermal expansion that makes it a poor choice for applications that are exposed to large changes in temperature. Conversely, for extended temperature operation silicon nitride may be used. Silicon nitride more closely matches the coefficient of thermal expansion of a semiconductor wafer than does alumina, although it is more costly. There are no limitations on the nature of the ceramic used to form the interposer substrate of the present invention other than the requirements of the specific application envisioned.

The connection pads 140 on the upper surfaces of the ceramic substrate 110 correspond with a second set of connectivity pads 210 on the lower surface of the ceramic substrate that in turn match up with the RDL pads on the semiconductor wafer 100. The connectivity pads 210 on the lower surface of the ceramic substrate are not visible in FIG. 1. The two sets of connectivity pads on the upper and lower surfaces of the ceramic substrate are connected by vias.

It is important that the surfaces of the semiconductor wafer and the ceramic substrate that will meet when the interposer assembly is formed are very flat. Due to the nature of the processing involved to produce the semiconductor wafer, they are generally already very flat. The ceramic substrate can be polished on the lower surface in order to achieve approximately the same flatness as that of the semiconductor wafer. The polishing will be done prior to the addition of the connectivity pads to the lower surface of the ceramic substrate.

Figure 2:
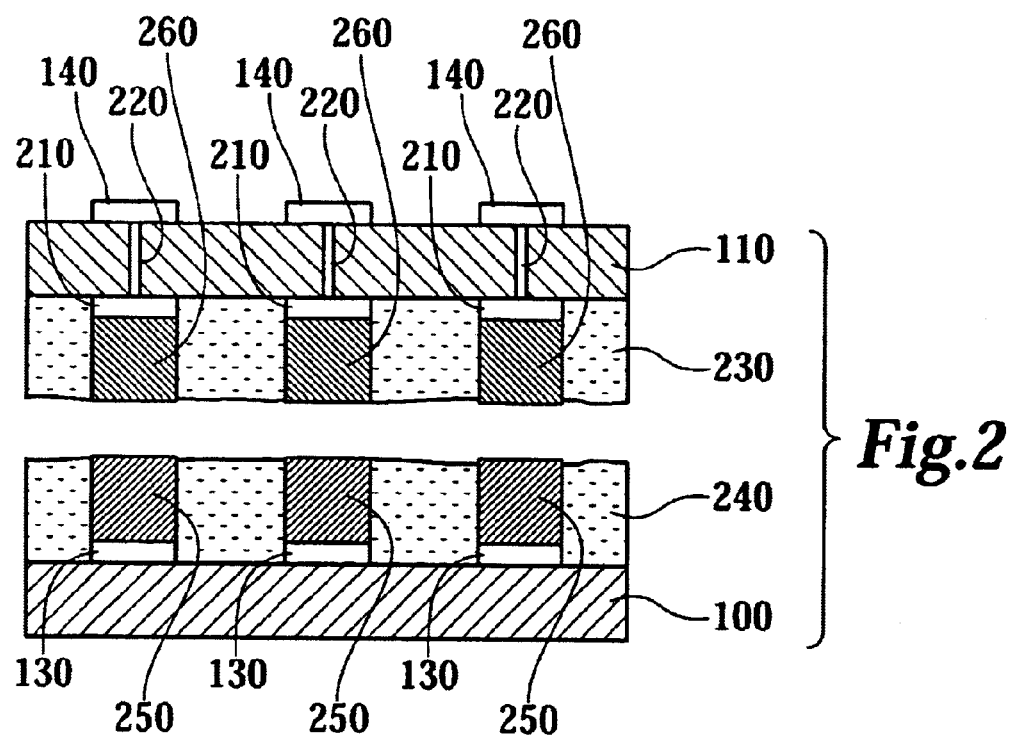
FIG. 2 depicts a side view of an interposer substrate and a semiconductor wafer prior to attachment in accordance with the present invention.

FIG. 2 depicts a side view of the semiconductor wafer 100 the ceramic substrate 110 after the application of a conductor 250, 260 and a no-flow underfill 230, 240. The wafer and substrate are now ready to be joined to form an interposer assembly. At this point the underfill is not cured. The conductor 250 is applied to the pads 130 of the semiconductor wafer 100. The method of application may be screen printing, dispensing or any other method known in the industry. The material making up the conductor may be solder or conductive polymeric adhesive or conductive plastic. The height of the column of conductor will be approximately equal to the diameter of the connectivity pad 130. A layer of no-flow underfill 240 is applied after the application of the conductor.

An analogous process is carried out with the ceramic substrate. Conductor 260 is applied to connectivity pads 210, followed by the application of no-flow underfill 230. The column height of the conductor is approximately the same as the corresponding column of conductor applied to the semiconductor wafer 100. The electrical pathways or vias 220 that connect the two sets of connectivity pads of the ceramic substrate 140, 210 are also depicted in FIG. 2.

Figure 3:
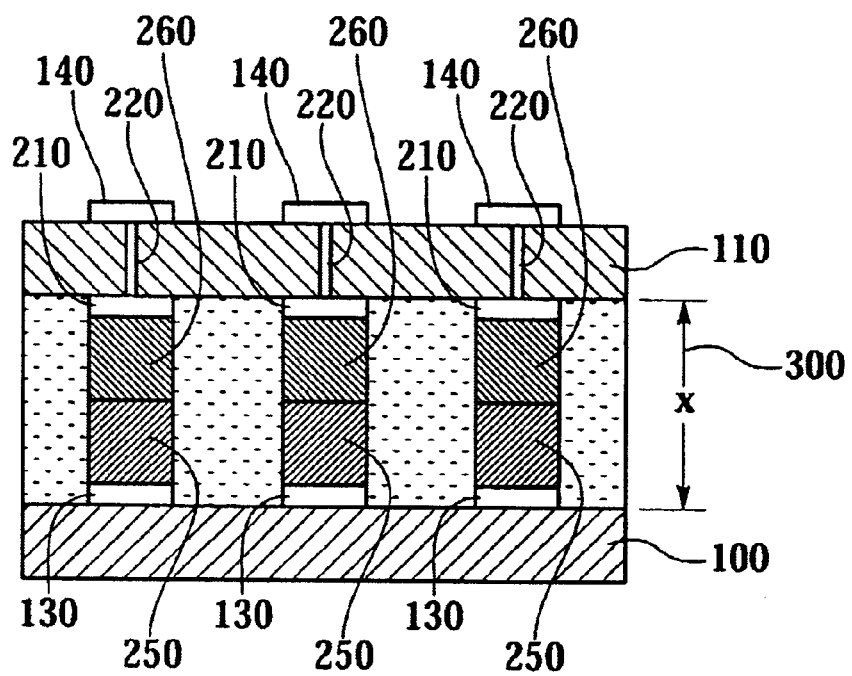
FIG. 3 depicts a side view of an interposer substrate and a semiconductor wafer after attachment to form an interposer assembly in accordance with the present invention.

FIG. 3 depicts the ceramic substrate 110 connected to the semiconductor wafer 100, thus forming an interposer assembly. The substrate and the wafer are aligned and then brought together. Many means for alignment may be used, including aligning the edges of the respective components as well as the use of fiducials located on the wafers. Split vision optics may also be employed for alignment.

Once the substrate and wafer have been aligned and brought together such that the columns of conductor 260 are in contact with the columns of conductor 250, the assembly is then heated to fuse the two columns of conductor, if necessary, and to cure the underfill. When joining the two components of the interposer assembly, a certain amount of "over travel" may be required to make sure that contact is made between all of the respective columns of conductor. This technique will compensate for slight differences in the height of the columns of conductor as well as minor deviations from planarity of either the ceramic substrate or the semiconductor wafer. If the exact distance required to bring the two tallest columns together is x as shown in FIG. 3, then the substrate and the wafer would be brought within x-y, where y is the difference between the tallest column of conductor and the shortest column. This would insure that all of the connections are made, and increase the production of good dies. The result would be that some of the columns would have excess conductor, but this would expand into the surrounding underfill and eventually produce a slightly wider column of conductor during the reflow and curing process.

The connectivity pads 140 are the points of connection when the die is eventually attached to a printed circuit board or other surface. The entire connection path of the interposer assembly is defined starting with the peripheral connection pads 120 and proceeding through the RDL pads 130, the columns of conductor 250 and 260, to pads 210, by way of the electrical pathways or vias 220 and ending at the connectivity pads 140. The interposer assembly is then heated reflow and cure and reflow the columns of conductor and to cure the underfill.

The relatively tall columns of conductor in the completed interposer assembly, that are formed as a result of applying conductor to both the semiconductor wafer and the ceramic substrate prior to assembly, serve to compensate for thermal mismatches between the ceramic and wafer. In essence the tall column can adjust to any slight lateral movement cause by a thermal mismatch between the components. The underfill serves to suppress this lateral movement.

Once the interposer assembly has been formed, testing of the dies on the semiconductor wafer can proceed. The large connectivity pads 140 on the interposer assembly facilitate connection with burn-in boards or automated test equipment. The last test before the interposer assembly is diced into separate die units is to create a map of the die positions that indicates which are acceptable for further use. Following the dicing procedure the unacceptable units are culled and discarded.

Figure 4:
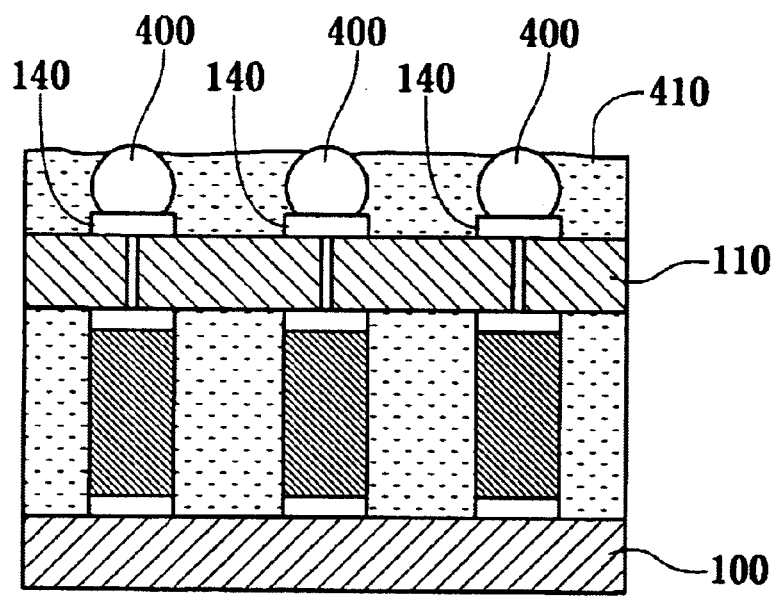
FIG. 4 depicts a side view of an interposer assembly in accordance with the present invention.

Solder bumps 400 are applied to pads 140 after testing. FIG. 4 depicts the interposer assembly following testing where the solder bumps have been applied, as well as a layer of low-melting underfill 410. The low-melting underfill is chosen so that it is a solid at room temperature, but that during attachment of the circuit to a printed circuit board or other surface, it will flow at the same temperature as the solder bumps in order to assure good adhesion. The low-melting underfill will compensate for any thermal mismatches between the ceramic portion of the interposer assembly and the printed circuit board or other surface to which the assembly is attached.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is not intended to be exhaustive or to limit the scope of the invention. Many modifications and variations are possible in light of the above teaching without departing from the spirit and scope of the following claims. It is contemplated that the use of the present invention can involve components having different characteristics. It is intended that the scope of the present invention be defined by the claims appended hereto, giving full cognizance to equivalents in all respects.

What is claimed is:

1. An interposer assembly comprising:
   a ceramic substrate having an upper surface and a lower surface, one or more first electrical contacts on the lower surface, one or more second electrical contacts on the upper surface, one or more electrical pathways passing through the ceramic substrate, and connecting the first electrical contacts to the second electrical contacts;
   a semiconductor wafer including one or more semiconductor dies, and having an upper surface and a lower surface, one or more third electrical contacts on the upper surface of the semiconductor wafer, the third electrical contacts being associated with the semiconductor dies, wherein the ceramic substrate is operable to remain attached to the semiconductor die after the ceramic substrate and semiconductor wafer are singulated;

a conductor electrically connecting each first electrical contact with a corresponding third electrical contact; and a layer of no-flow underfill disposed between the upper surface of the semiconductor wafer and the lower surface of the ceramic substrate.

2. The interposer assembly as recited in claim 1 wherein the first, second and third electrical contacts are connection pads.

3. The interposer assembly as recited in claim 1 wherein the conductor comprises solder.

4. The interposer assembly as recited in claim 1 wherein the conductor comprises a conductive-polymer containing adhesive.

5. The interposer assembly as recited in claim 1 wherein the conductor comprises a conductive plastic.

6. A method for producing an interposer assembly comprising the steps of:

creating one or more electrical pathways passing through a ceramic substrate having an upper surface and a lower surface;

attaching one or more first electrical contacts to the one or more electrical pathways on the lower surface of the ceramic substrate;

attaching one or more second electrical contacts to the one or more electrical pathways on the upper surface of the ceramic substrate;

depositing a conductor and a no-flow underfill and bonding the ceramic substrate to a semiconductor wafer such that the conductor and underfill form an adhesive bond between the lower surface ceramic substrate and the semiconductor wafer; and singulating the ceramic substrate and semiconductor wafer into a plurality of semiconductor die assemblies.

7. The method recited in claim 6, wherein the conductor is applied to the first electrical contacts on the lower surface of the ceramic substrate, and the no-flow underfill is applied to the lower surface of the ceramic substrate.

8. The method recited in claim 6, wherein the semiconductor wafer has an upper surface and a lower surface, and the conductor is applied to one or more third electrical contacts on the upper surface of the semiconductor wafer; and the no-flow underfill is applied to the upper surface of the semiconductor wafer.

9. The method recited in claim 6, wherein:

the conductor is applied to the first set of electrical contacts on the lower surface of the ceramic substrate and to one or more third electrical contacts on an upper surface of the semiconductor wafer; and the no-flow underfill is applied to the lower surface of the ceramic substrate and the upper surface of the semiconductor wafer.

10. The method recited in claim 6, wherein the ceramic substrate and the semiconductor wafer are aligned so that electrical contact is made possible between the second electrical contacts on the upper surface of the ceramic substrate and one or more third electrical contacts on an upper surface of the semiconductor wafer by the bonding.

11. The method recited in claim 6 further comprising:

placing solder balls on the second electrical contacts on the upper surface of the ceramic substrate; and applying a low-melting underfill to the upper surface of the ceramic substrate.

12. The method as recited in claim 6 wherein the first and second electrical contacts comprise connection pads.

13. The method as recited in claim 9 further comprising the step of applying additional metalization to one or more of the third electrical contacts to redistribute them prior to the attachment of the substrate.

14. The method as recited in claim 9 further comprising the step of adding additional metalization to one or more of the third electrical contacts to improve the contact between the conductor and the third electrical contacts.

15. The method as recited in claim 6 where in the step of attaching the ceramic substrate to the semiconductor wafer comprises of steps of:

placing the semiconductor wafer on a first flat surface and holding the semiconductor wafer in place;

placing the ceramic substrate on a second flat surface and holding the substrate in place; and bringing the first and second flat surfaces together so that the semiconductor wafer and the substrate form an adhesive bond.

16. The method as recited in claim 6 further comprising the step of singulating the interposer assembly into one or more semiconductor die assemblies.

17. The method as recited in claim 6 wherein the underfill forms a rigid bond.

18. The method as recited in claim 6 wherein the underfill forms a semi-rigid bond.

19. The method as recited in claim 6 wherein the underfill forms a compliant bond.

20. The method as recited in claim 6 wherein the conductor comprises a solder ball.

21. The method as recited in claim 6 wherein the conductor comprises a conductive-polymer adhesive.

22. The method as recited in claim 6 wherein the conductor comprises a conductive plastic.

23. The method as recited in claim 6 further comprising the steps:

attaching the substrate and semiconductor wafer assembly to a testing apparatus; and testing at least one of the semiconductor dies.

24. The method as recited in claim 23 wherein the step of testing the semiconductor dies further comprises performing parametric testing on at least one of the dies.

25. The method as recited in claim 23 wherein the step of testing the semiconductor dies further comprises performing burn-in testing on at least one of the dies.

26. The method as recited in claim 23 wherein the step of testing the semiconductor dies further comprises testing the semiconductor dies in sequence.

27. The method as recited in claim 23 wherein the step of testing the semiconductor dies further comprises testing the semiconductor dies simultaneously.

28. The method as recited in claim 23 further comprising the step of grading one or more performance characteristics of each semiconductor die during testing.

29. The method as recited in claim 28 further comprising the step of sorting the semiconductor die assemblies based on the one or more performance characteristics.

30. The method as recited in claim 23 further comprising the step of sorting the semiconductor die assemblies into conforming and nonconforming groups.

31. The product manufactured by the process of claim 6.

* * * * *